United States Patent
Lee et al.

(10) Patent No.: US 9,929,716 B2
(45) Date of Patent: Mar. 27, 2018

(54) ACOUSTIC RESONATOR AND METHOD OF MANUFACTURING THE SAME

(71) Applicant: Samsung Electro-Mechanics Co., Ltd., Suwon-si (KR)

(72) Inventors: Moon Chul Lee, Suwon-si (KR); Duck Hwan Kim, Suwon-si (KR); Yeong Gyu Lee, Suwon-si (KR); Chul Soo Kim, Suwon-si (KR); Jie Ai Yu, Suwon-si (KR); Sang Uk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 121 days.

(21) Appl. No.: 14/932,109

(22) Filed: Nov. 4, 2015

(65) Prior Publication Data

US 2016/0204761 A1 Jul. 14, 2016

(30) Foreign Application Priority Data

Jan. 12, 2015 (KR) .................. 10-2015-0003986

(51) Int. Cl.
*H03H 9/05* (2006.01)
*H03H 3/02* (2006.01)
*H03H 9/17* (2006.01)

(52) U.S. Cl.
CPC ............ *H03H 9/0514* (2013.01); *H03H 3/02* (2013.01); *H03H 9/0504* (2013.01); *H03H 9/173* (2013.01); *H03H 2003/021* (2013.01)

(58) Field of Classification Search
CPC ............... H03H 3/02; H03H 2003/021; H03H 2003/023; H03H 9/0504; H03H 9/0514; H03H 9/1014; H03H 9/105; H03H 9/13; H03H 9/132; H03H 9/173; H03H 9/174
USPC ................... 333/187; 310/348, 349; 257/774
See application file for complete search history.

(56) References Cited

U.S. PATENT DOCUMENTS

| | | | | |
|---|---|---|---|---|
| 5,629,237 | A | * 5/1997 | Wang | H01L 21/76804 257/E21.578 |
| 6,349,454 | B1 * | 2/2002 | Manfra | H03H 3/02 29/25.35 |
| 6,720,660 | B1 * | 4/2004 | Ushiyama | H01L 21/02126 257/632 |
| 9,787,280 | B2 * | 10/2017 | Son | H03H 9/02086 |
| 2005/0104204 | A1 * | 5/2005 | Kawakubo | B81C 1/00301 257/724 |
| 2006/0046463 | A1 * | 3/2006 | Watkins | H01L 21/76898 438/622 |

(Continued)

FOREIGN PATENT DOCUMENTS

| | | | | |
|---|---|---|---|---|
| JP | 10-286960 A | * 10/1998 | | B41J 2/14233 |
| JP | 2006-80244 A | 3/2006 | | |

(Continued)

*Primary Examiner* — Barbara Summons
(74) *Attorney, Agent, or Firm* — NSIP Law

(57) ABSTRACT

There are provided an acoustic resonator and a method of manufacturing the same. The acoustic resonator includes a resonance part including a first electrode, a second electrode, and a piezoelectric layer disposed between the first and second electrodes. The acoustic resonator also includes a substrate disposed below the resonance part and including a via hole penetrating through the substrate and a connection conductor disposed in the via hole and connected to at least one of the first and second electrodes.

18 Claims, 6 Drawing Sheets

(56) References Cited

U.S. PATENT DOCUMENTS

| | | | |
|---|---|---|---|
| 2006/0202769 A1* | 9/2006 | Nagao | H03H 3/02 331/73 |
| 2007/0115079 A1* | 5/2007 | Kubo | B81C 1/00238 333/189 |
| 2008/0081398 A1 | 4/2008 | Lee et al. | |
| 2011/0201197 A1* | 8/2011 | Nilsson | H01L 21/30604 438/638 |
| 2012/0049976 A1* | 3/2012 | Son | H03H 9/02149 333/133 |
| 2016/0079956 A1* | 3/2016 | Son | H03H 3/04 333/187 |

FOREIGN PATENT DOCUMENTS

| | | |
|---|---|---|
| KR | 10-2006-0076088 A | 7/2006 |
| KR | 10-2009-0055764 A | 6/2009 |

\* cited by examiner

ACOUSTIC RESONATOR AND METHOD OF MANUFACTURING THE SAME

CROSS-REFERENCE TO RELATED APPLICATION

This application claims the priority and benefit under 35 USC 119(a) of Korean Patent Application No. 10-2015-0003986 filed on Jan. 12, 2015, with the Korean Intellectual Property Office, the disclosure of which is incorporated herein by reference.

BACKGROUND

1. Field

The following description relates to an acoustic resonator and a method of manufacturing the same.

2. Description of Related Art

Recently, in response to a rapid development of communications technology, there is a demand for development of signal processing technology and radio frequency (RF) components technology in communications technology devices.

In accordance with the trend to miniaturize wireless communications devices, a miniaturization of radio frequency (RF) components, such as a bulk acoustic wave (BAW) resonator type filter using semiconductor thin film wafer manufacturing technology, is in demand.

A bulk acoustic wave (BAW) resonator is a thin film-type element having a structure able to generate resonance formed through depositing a piezoelectric dielectric material on a silicon wafer, such as a semiconductor substrate, using piezoelectric characteristics of the piezoelectric dielectric material. The BAW is commonly used as a filter.

The BAW resonator is used in devices such as small filters, light filters, oscillators, resonance elements, and acoustic resonance mass sensors of mobile communications devices or chemical and biological devices.

Further, research into structural shapes and functions to improve the characteristics and performance of BAW resonators has been conducted. In addition, there is a demand to further research on various structures and manufacturing methods for external electrodes electrically connecting a piezoelectric material to an external element.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided an acoustic resonator, including: a resonance part including a first electrode, a second electrode, and a piezoelectric layer disposed between the first and second electrodes; and a substrate disposed below the resonance part and including a via hole penetrating through the substrate and a connection conductor disposed in the via hole and connected to at least one of the first and second electrodes.

Inner surfaces of walls of the substrate forming the via hole may include inclined surfaces having different gradients.

The inclined surfaces may include a first inclined portion disposed adjacently to the resonance part, a third inclined portion disposed adjacently to a lower surface of the substrate, and a second inclined portion disposed between the first and third inclined portions.

An angle of inclination between the lower surface of the substrate and the inner wall of the via hole may be smaller in the first and third inclined portions than in the second inclined portion.

The second inclined portion may be longer than the first inclined portion and the third inclined portion, and the third inclined portion is shorter than the first inclined portion.

An inner wall of the second inclined portion may be perpendicular to the lower surface of the substrate.

A diameter of the via hole may be increased toward the lower surface of the substrate.

An inner wall of the third inclined portion may include a curved surface.

An inner wall of the third inclined portion may include a linear inclined surface.

A depth of the via hole is larger than a maximum diameter of the via hole.

The connection conductor may include a first connection conductor and a second connection conductor, wherein the first connection conductor electrically connects the first electrode to an external electrode, and the second connection conductor electrically connects the second electrode to the external electrode.

In accordance with an embodiment, there is provided a method to manufacture an acoustic resonator, the method including: forming a resonance part on a substrate; forming a portion of a via hole in the substrate through wet etching; completing the via hole in the substrate through dry etching; and forming a connection conductor around the via hole.

The forming of the portion of the via hole may include forming the via hole with a depth corresponding to a half of a thickness of the substrate.

The completing of the via hole may include forming inclined surfaces having different gradients on an inner surfaces of walls of the substrate forming the via hole.

The completing of the via hole may include forming a first inclined portion adjacently to the resonance part, forming a third inclined portion adjacently to a lower surface of the substrate, and forming a second inclined portion between the first and third inclined portions.

The completing of the via hole may include forming an angle of inclination between the lower surface of the substrate and an inner wall of the second inclined portion, wherein the angle of inclination is larger than angles of inclination between the lower surface of the substrate and inner walls of the first and third inclined portions.

The forming of the resonance part may include: forming a first electrode on the substrate; forming a piezoelectric layer on the first electrode; and forming a second electrode on the piezoelectric layer.

In the forming of the connection conductor, one end of the connection conductor may be bonded to the first electrode or the second electrode through the via hole.

Other features and aspects will be apparent from the following detailed description, the drawings, and the claims.

BRIEF DESCRIPTION OF DRAWINGS

The above and other aspects, features and advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
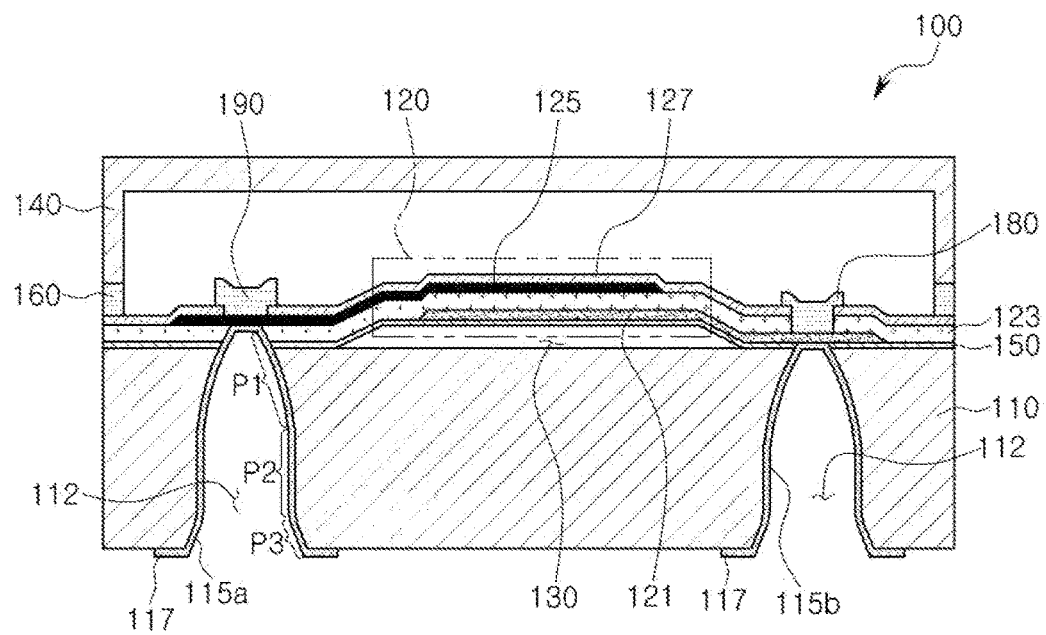
FIG. 1 is a cross-sectional view of an acoustic resonator, according to an embodiment.

FIG. 1 is a cross-sectional view of an acoustic resonator, according to an embodiment.

Referring to FIG. 1, an acoustic resonator 100, according to an embodiment, includes a substrate 110 and a resonance part 120.

An air gap 130 is formed between the substrate 110 and the resonance part 120. The resonance part 120 is formed on a membrane layer 150 to be spaced apart from the substrate 110 through the air gap 130.

The substrate 110 is a silicon substrate or a silicon-on-insulator (SOI) type substrate. However, the substrate 110 is not limited thereto and may be formed of other materials.

The resonance part 120 includes a first electrode 121, a piezoelectric layer 123, and a second electrode 125. The resonance part 120 is formed by sequentially stacking the first electrode 121, the piezoelectric layer 123, and the second electrode 125 from the bottom. Therefore, the piezoelectric layer 123 is disposed between the first electrode 121 and the second electrode 125.

Because the resonance part 120 is formed on the membrane layer 150, the membrane layer 150, the first electrode 121, the piezoelectric layer 123, and the second electrode 125 are sequentially formed on the substrate 110. However, the sequence of the layers and electrodes in the resonance part 120 may vary. For example, the membrane layer 150, the first electrode 121, the second electrode 125, and the piezoelectric layer 123 are sequentially formed on the substrate 110.

The resonance part 120 resonates the piezoelectric layer 123 as a function of or based on signals applied to the first electrode 121 and the second electrode 125 to generate a resonance frequency and a semi-resonance frequency.

The first electrode 121 and the second electrode 125 are formed of a metal such as gold, molybdenum, ruthenium, aluminum, platinum, titanium, tungsten, palladium, chromium, or nickel.

The resonance part 120 uses an acoustic wave of the piezoelectric layer 123. For example, when a signal is applied to the first electrode 121 and the second electrode 125, mechanical vibrations are generated in a thickness direction of the piezoelectric layer 123, such that an acoustic wave is generated.

In one example, the piezoelectric layer 123 includes at least one of zinc oxide (ZnO), aluminum nitride (AlN), and quartz. Other elements may be included in the piezoelectric layer 123.

A resonance phenomenon of the piezoelectric layer 123 is generated when one-half (½) of a wavelength of the applied signal coincides with a thickness of the piezoelectric layer 123. When the resonance phenomenon is generated, electrical impedance rapidly changes. Therefore, the acoustic resonator 100, according to an embodiment, is used as a filter that selects a frequency.

The resonance frequency is determined, for example, by the thickness of the piezoelectric layer 123, the first and second electrodes 121 and 125 enclosing the piezoelectric layer 123, a unique elastic wave velocity of the piezoelectric layer 123. Other structural elements or factors may be used to determine the resonance frequency.

For example, as the thickness of the piezoelectric layer 123 is decreased, the resonance frequency is increased.

The resonance part 120 also includes a protection layer 127. The protection layer 127 is formed on the second electrode 125 to prevent the second electrode 125 from being exposed to an external environment.

The first electrode 121 and the second electrode 125 are formed outside the piezoelectric layer 123. A first connection electrode 180 and a second connection electrode 190 are connected to the first electrode 121 and the second electrode 125, respectively.

The first connection electrode 180 and the second connection electrode 190 are used to check characteristics of a resonator and a filter and perform required frequency trimming. However, the first and second connection electrodes 180 and 190 are not limited to this configuration and both electrodes may produce other information and functionality.

The resonance part 120 is disposed to be spaced apart from the substrate 110 through the air gap 130 in order to improve a quality factor.

For example, the air gap 130 is formed between the resonance part 120 and the substrate 110 to prevent the substrate 110 from affecting the acoustic wave generated in the piezoelectric layer 123. In one example, the air gap 130 is a space or an empty space.

In addition, the air gap 130 improve reflection characteristics of the acoustic wave generated in the resonance part 120. Because impedance of the air gap 130 is close to infinity, the acoustic wave is not lost and remains in the resonance part 120.

Therefore, loss of the acoustic wave in a longitudinal direction is decreased through the air gap 130, thus, improving a quality factor value of the resonance part 120.

A plurality of via holes 112 penetrating through the substrate 110 are formed in a lower surface of the substrate 110. In addition, connection conductors 115a and 115b are formed in respective via holes 112.

In one illustrative example, connection conductors 115a and 115b are formed over entire inner surfaces of walls of the substrate 110 forming the via holes 112.

In addition, one of corresponding ends of the connection conductors 115a and 115b are connected to an external electrode 117 formed on the lower surface of the substrate 110 and the other ends of the connection conductors 115a and 115b are connected to the first electrode 121 or the second electrode 125.

For example, according to an embodiment, a first connection conductor 115a electrically connects the first electrode 121 to the external electrode 117, and a second connection conductor 115b electrically connects the second electrode 125 to the external electrode 117.

Therefore, the first connection conductor 115a is electrically connected to the first electrode 121, while penetrating through the substrate 110 and the membrane layer 150. The second connection conductor 115b is electrically connected to the second electrode 125, while penetrating through the substrate 110, the membrane layer 150, and the piezoelectric layer 123.

Further, although only two via holes 112 and two connection conductors 115a and 115b are illustrated in the embodiment, the number of via holes 112 and the number of connection conductors 115a and 115b are not limited thereto. Three or more via holes and three or more connection conductors may be provided, if necessary. Further, if necessary, one via hole and one connection conductor may be included.

A cross-sectional area of the via hole 112, according to an embodiment, is larger toward a lower surface of the substrate 110. In addition, the inner surfaces of walls of the substrate 110 forming each via hole 112, according an embodiment include at least two inclined surfaces having different inclined angles. In one example, the inclined angles are acute angles formed by the lower flat surface of the substrate 110 and the inner surfaces of the via hole 112.

Figure 14:
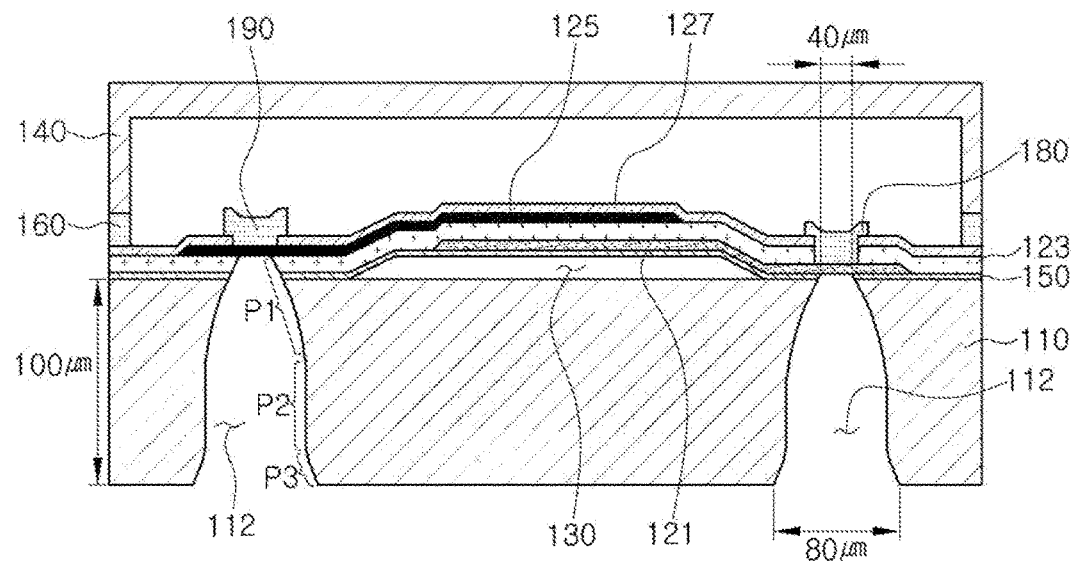

In one example, the via hole 112 of the substrate 110 are divided into a first inclined portion P1 formed adjacently to the resonance part 120, a third inclined portion P3 formed adjacently to the lower surface of the substrate 110, and a second inclined portion P2 connecting the first and third inclined portions P1 and P3 to each other, as illustrated in FIGS. 1 and 14.

In one example, the second inclined portion P2 is formed as an inclined surface perpendicular to or substantially perpendicular to a lower surface or base of the substrate 110. The first and third inclined portions P1 and P3 are formed as slightly different inclined surfaces than an inclined surface of the second inclined portion P2.

Therefore, the via hole 112, according to an embodiment, includes three inclined surfaces having different inclined angles. In addition, because the second inclined portion P2 is formed as the inclined surface substantially perpendicular to the lower surface of the substrate 110, a cross-sectional area of the via hole 112 in the second inclined portion P2 does not significantly increase, but is approximately constantly maintained.

Therefore, a cross-sectional area of the via hole 112 increases toward the lower surface of the substrate 110 in the third inclined portion P3, remains approximately constant in the second inclined portion P2, and decreases toward the resonance part 120 in the first inclined portion P1.

In addition, in the via hole 112, according to an embodiment, the second inclined portion P2 is longer than the first inclined portion P1 and the third inclined portion P3. The third inclined portion P3 is shorter than the first inclined portion P1.

Next, a method of manufacturing an acoustic resonator, according to an embodiment, will be described.

FIGS. 2 through 15 are views illustrating a method of manufacturing an acoustic resonator, according to an embodiment.

Figure 2:
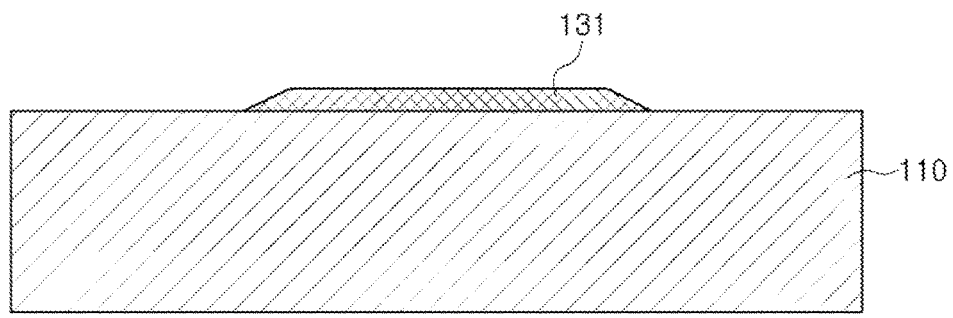
FIGS. 2 through 15 are views illustrating a method to manufacture an acoustic resonator, according to an embodiment.

Referring to FIG. 2, a sacrificial layer 131 is formed on the substrate 110. The layer 131 is referred to as sacrificial as it will be later removed to form the air gap 130.

In one example, a wafer is used as the substrate 110. In addition, the wafer is divided into a plurality of element regions. Operations described below are collectively performed on each element region.

The sacrificial layer 131 is removed through a subsequent etching process to form the air gap 130 (see FIG. 1). The sacrificial layer 131 may be formed of polysilicon or polymer.

Figure 3:
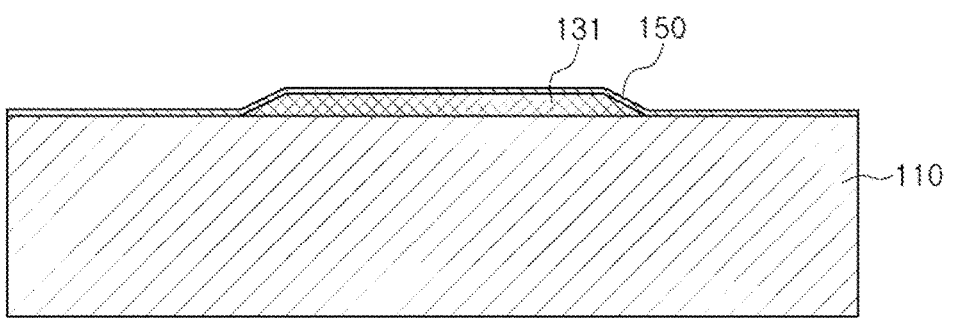
Figure 4:
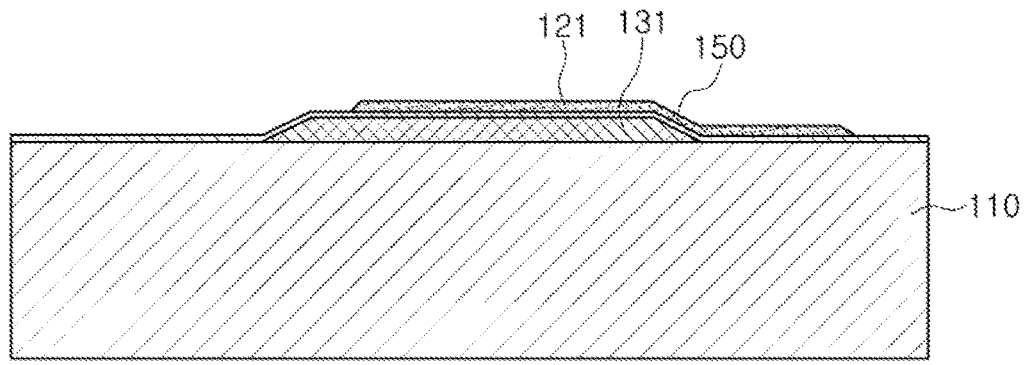

Further, as illustrated in FIGS. 3 and 4, the membrane layer 150 and the first electrode 121 are sequentially formed on the sacrificial layer 131.

The membrane layer 150 is positioned on the air gap 130 to maintain a shape of the air gap 130 and support a structure of the resonance part 120.

The first electrode 121 is formed with patterns by forming a conductive layer on the membrane layer 150, depositing a photo-resist on the conductive layer, patterning the photo-resist using a photolithography process, and then removing unnecessary portions using the patterned photo-resist as a mask.

In an embodiment, the first electrode 121 is formed of molybdenum (Mo). However, a material of the first electrode 121 is not limited thereto. That is, various metals such as gold, ruthenium, aluminum, platinum, titanium, tungsten, palladium, chromium, or nickel, may be used as a material to form the first electrode 121.

Figure 5:
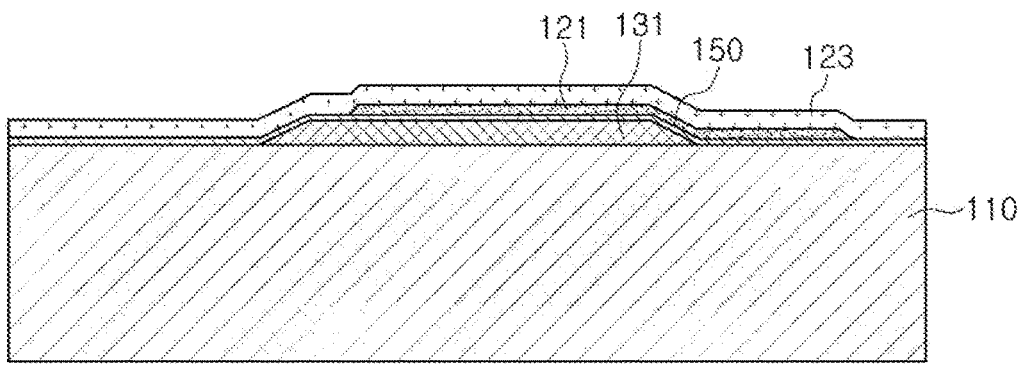

As illustrated in FIG. 5, the piezoelectric layer 123 is formed on the first electrode 121.

In an embodiment, the piezoelectric layer 123 is formed of aluminum nitride (AlN). However, a material of the piezoelectric layer 123 is not limited thereto. That is, various piezoelectric materials, such as zinc oxide (ZnO) or quartz, may be used as a material to form the piezoelectric layer 123.

Figure 6:
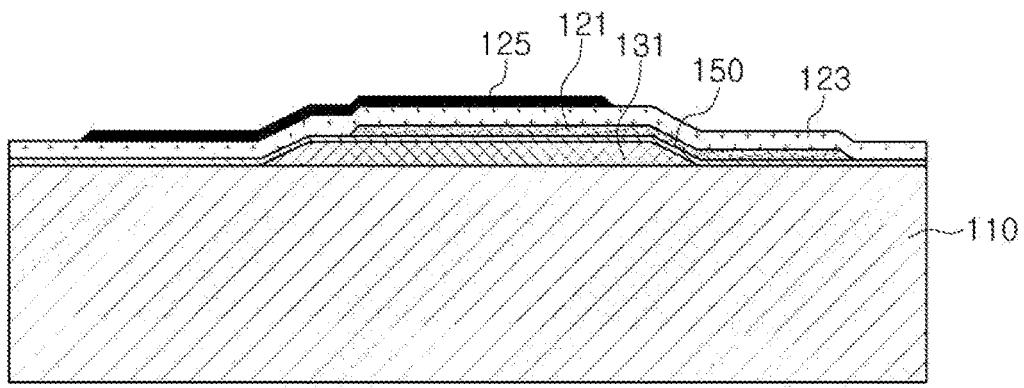

As illustrated in FIG. 6, the second electrode 125 is formed on the piezoelectric layer 123.

The second electrode 125 is formed with patterns by forming a conductive layer on the piezoelectric layer 123, depositing a photo-resist on the conductive layer, patterning the photo-resist using a photolithography process, and then removing unnecessary portions using the patterned photo-resist as a mask.

In an embodiment, the second electrode 125 is formed of ruthenium (Ru). However, a material of the second electrode 125 is not limited thereto. That is, various metals such as gold, molybdenum, aluminum, platinum, titanium, tungsten, palladium, chromium, or nickel, may be used as a material to form the second electrode 125.

Figure 7:
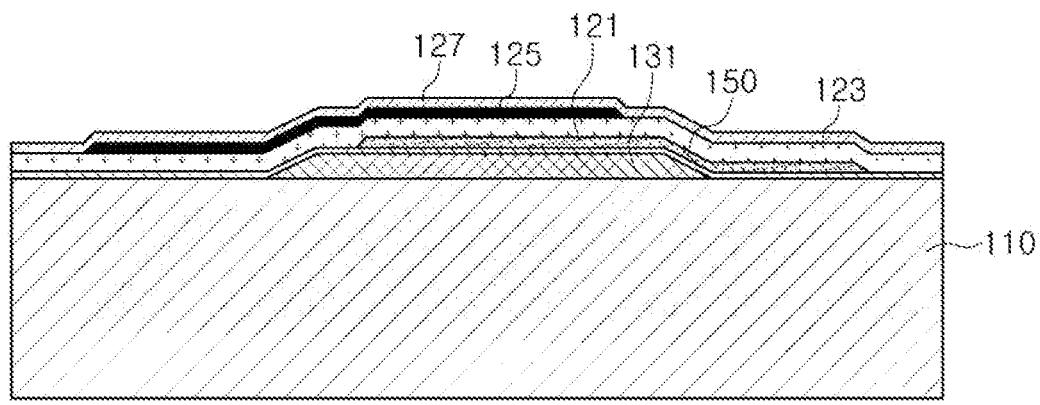

As illustrated in FIG. 7, the protection layer 127 is formed on the second electrode 125 and the piezoelectric layer 123.

The protection layer 127 is formed of an insulating material. In one example, the insulating material includes at least one of a silicon oxide based material, a silicon nitride based material, and an aluminum nitride based material. The insulating may also be formed of other based materials in addition to the at least one of the silicon oxide based material, the silicon nitride based material, and the aluminum nitride based material.

Figure 8:
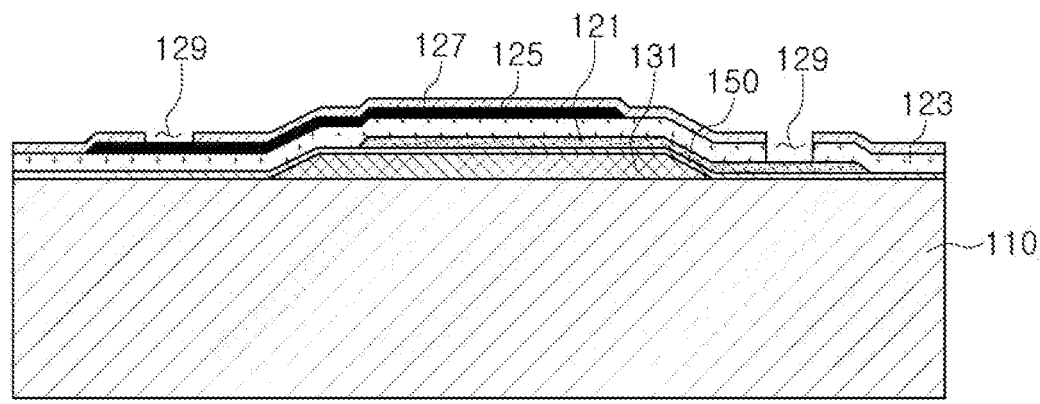
Figure 9:
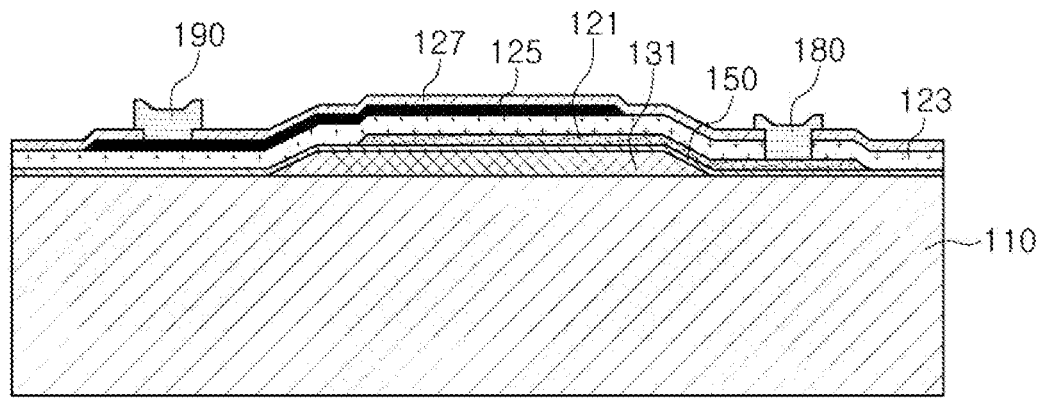

As illustrated in FIGS. 8 and 9, connection electrodes (hereinafter, referred to as upper electrodes) for frequency trimming are formed on the first electrode 121 and the second electrode 125. The connection electrodes 180 and 190 are formed on the first and second electrodes 121 and 125, respectively, and are bonded to the first and second electrodes, respectively, while penetrating through the protection layer 127 or the piezoelectric layer 123.

The first connection electrode 180 is formed by partially removing through etching the protection layer 127 and the piezoelectric layer 123 to form a hole 129 and expose the first electrode 121, externally, and then depositing gold (Au), copper (Cu), or other alloys, on the first electrode 121.

Likewise, the second connection electrode 190 is formed by partially removing through etching the protection layer 127 to form a hole 129 and expose the second electrode 125, externally, and then depositing gold (Au), copper (Cu), or other alloys, on the second electrode 125.

Figure 10:
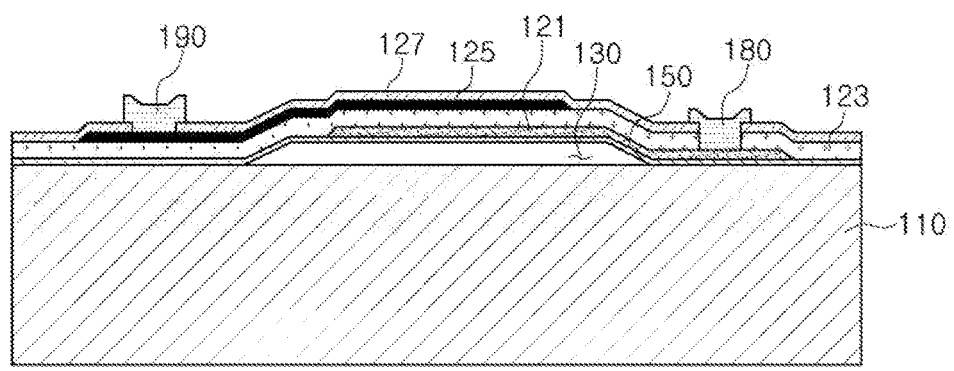

As illustrated in FIG. 10, the air gap 130 is formed after the connection electrodes 180 and 190 are used to check characteristics of the resonance part 120 and the filter and perform required frequency trimming.

The air gap 130 is formed by removing the sacrificial layer 131 (see FIG. 9), and accordingly, the resonance part 120 (see FIG. 1) is completed. Here, the sacrificial layer 131 may be removed through dry etching. However, a method of removing the sacrificial layer 131 is not limited thereto.

Figure 11:
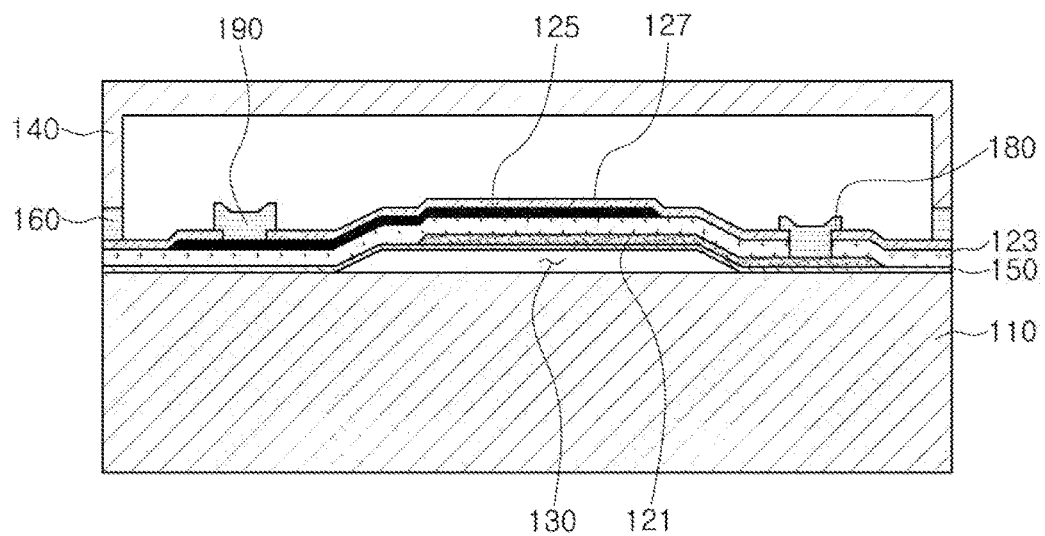

Then, as illustrated in FIG. 11, a cap 140 is formed in order to protect the resonance part 120 from an external environment. The cap 140 is formed through wafer bonding in a wafer level. That is, a substrate wafer, in which a plurality of unit substrates 110 is formed, and a cap wafer, in which a plurality of caps 140 is formed, are bonded together to be integrally formed with each other.

In addition, the substrate wafer and the cap wafer, bonded together, are subsequently cut to be divided into a plurality of individual acoustic resonators.

The cap 140 has a shape of a cover, including an internal space in which the resonance part 120 is accommodated.

The cap 140, according to an embodiment, is bonded to the substrate 110 using eutectic bonding. In this case, after a metal 160 that is eutectically bonded to the substrate 110 is deposited on the substrate 110, the substrate wafer and the cap wafer are pressed and heated to bond the cap 140 to the substrate 110.

Then, the connection conductors 115a and 115b (see FIG. 1) and the external electrodes 117 are formed. Prior to such formation, one surface, for example, a lower surface, of the substrate 110 is processed in order to decrease a thickness of the substrate 110, if needed.

In the formation of the connection conductors 115a and 115b, the via holes 112 (See FIG. 14) are formed first.

The via holes 112, according to an embodiment, are formed using wet etching and dry etching. For example, the wet etching and the dry etching are sequentially performed to form the via holes 112.

Figure 12:
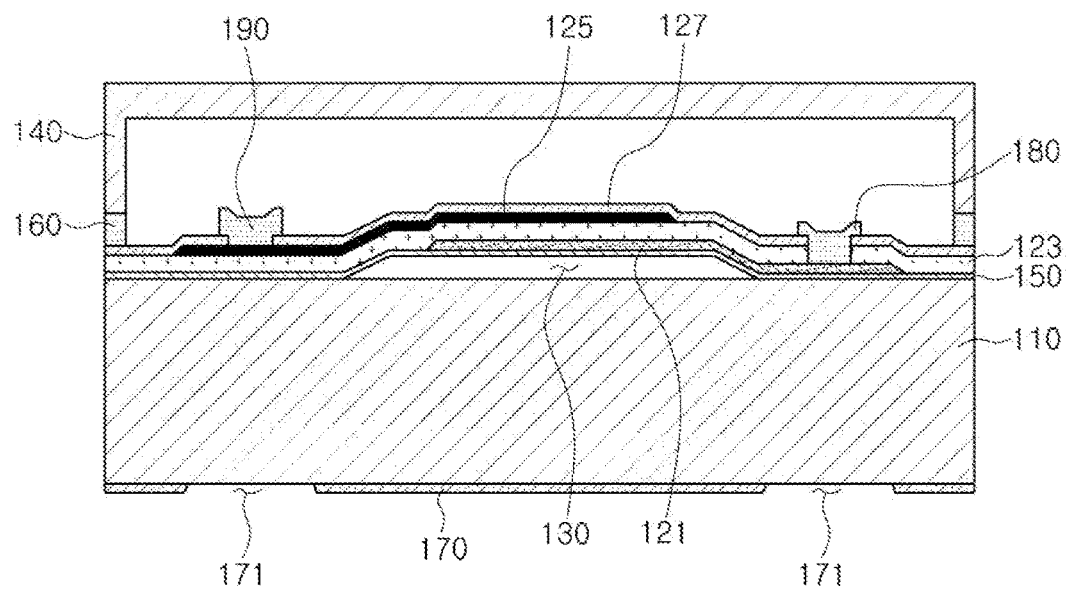

As illustrated in FIG. 12, a mask layer is formed on the lower surface of the substrate 110 and is patterned to form an etching mask 170. In this example, the mask layer is formed by depositing $SiO_2$ or an oxide. In addition, in the etching mask 170, holes 171 are formed in portions of the substrate 110 in which the via holes 112 are to be formed.

Figure 13:
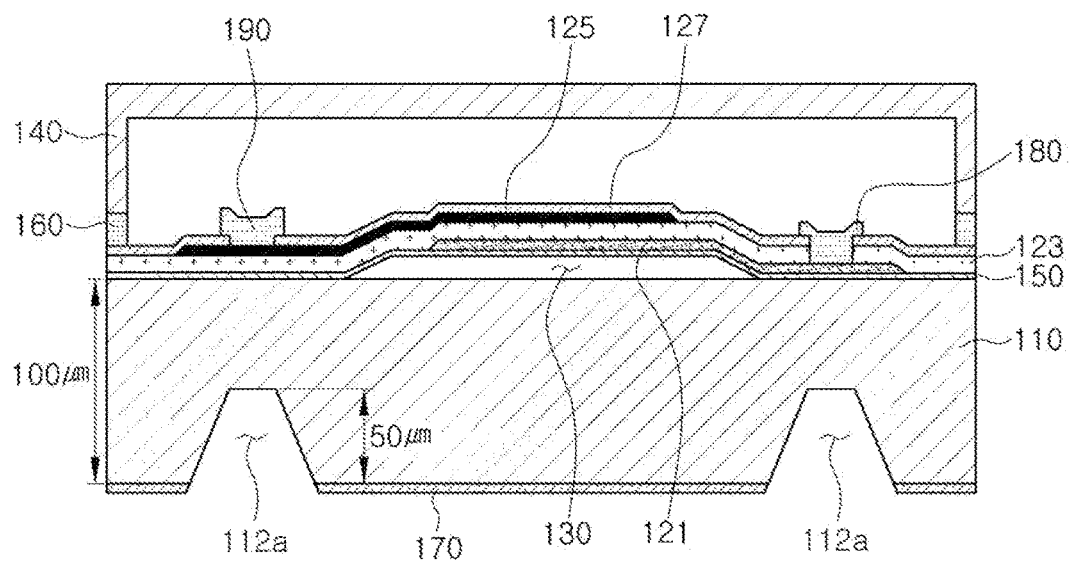

As illustrated in FIG. 13, the wet etching is performed using an etchant. Therefore, the etching operation is performed on the substrate 110 through the above-mentioned holes 171 to gradually form the via holes.

In the wet etching operation, according to an embodiment, the substrate 110 is partially etched to form portions of the via holes 112. For example, a depth of an initial via hole 112a formed through the wet etching may be approximately a half of the thickness of the substrate 110. However, a depth of the initial via hole 112a is not limited thereto. The depth of the initial via hole 112a may be of different depths.

Therefore, when the wet etching is completed, the initial via hole 112a is formed in a recess shape rather than a hole shape penetrating the substrate 110, as illustrated in FIG. 13.

In addition, due to characteristics of the wet etching, the initial via hole 112a formed through the wet etching has an inner wall of which a horizontal cross-sectional area (or a diameter) is decreased toward an inner portion of the substrate 110. In one example, the inner wall is formed of one inclined surface having the same gradient.

As illustrated in FIG. 14, the via holes 112 are completed through the dry etching. The dry etching is performed by, for example, a BOSCH operation.

In this operation, the via holes 112 are formed while penetrating the membrane layer 150 and the substrate 110. Therefore, at least a portion of the first electrode 121 is exposed through one of the via holes 112.

In addition, in order to expose the second electrode 125, one of the via holes 112 corresponding to the second electrode 125 is formed while removing the piezoelectric layer 123 disposed on the membrane layer 150.

Therefore, the second electrode 125 is also exposed through the one corresponding via hole 112.

The via holes 112 formed through the dry etching have a shape in which initial via holes 112a, as shown, for example, in FIG. 13, formed through the wet etching are further etched toward the first and second electrodes 121 and 125. Therefore, as a result from straight etching through the BOSCH operation, a cross-sectional area of the one of via holes 112 is the same as or similar to a maximum cross-sectional area of the initial via hole 112a, and a depth thereof is deeper than that of the initial via hole 112a. Therefore, the first and second inclined portions P1 and P2 are formed.

The second inclined portion P2 has an inner wall of which a horizontal cross-sectional area (or a diameter) is not changed or is slightly decreased toward the first inclined portion P1. Therefore, the second inclined portion P2 is substantially perpendicular to the lower surface of the substrate 110.

Therefore, an increase (or a decrease) ratio in a horizontal cross-sectional area per unit length is smaller in the second inclined portion P2 than in the first inclined portion P1. In addition, the second inclined portion P2 is also formed to have the same horizontal cross-sectional area, if necessary.

Furthermore, as shown in FIG. 14, although the first inclined portion P1 is illustrated to have a curved surface of which a gradient of an inner wall is not constant, the first inclined portion P1 is not limited to being formed as the curved surface. The first inclined portion P1 may also be formed as a linear inclined surface of which a gradient is constant. This may be similarly applied to the third inclined portion P3.

The third inclined portion P3 is formed at an inlet portion of the one of the via holes 112 formed in the lower surface of the substrate 110. The third inclined portion P3 is formed to have a cross-sectional area larger than that of the second inclined portion P2, and is formed to have a curved surface.

Therefore, the third inclined portion P3 is formed by smoothly chamfering an edge at which the lower surface of the substrate 110 and the second inclined portion P2 meet as a curved surface.

Figure 15:
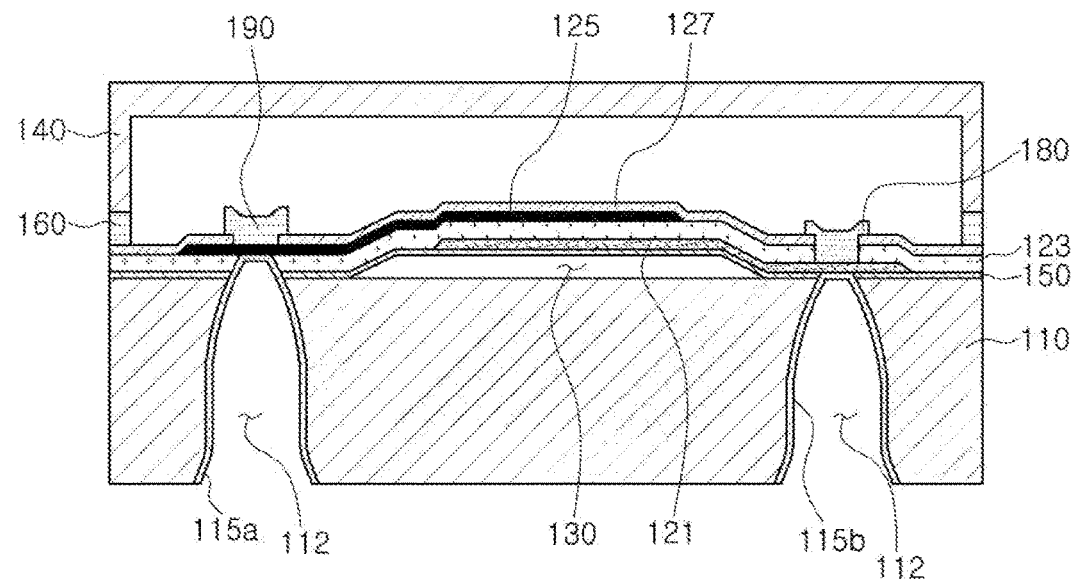

As illustrated in FIG. 15, the connection conductors 115a and 115b are formed in the via holes 112.

The connection conductors 115a and 115b are formed by forming conductive layers on inner surfaces of the via holes 112. For example, the connection conductors 115a and 115b are formed by depositing, applying, or filling a conductive metal, such as, gold or copper, on inner walls of the via holes 112.

In the method of manufacturing an acoustic resonator, according to an embodiment, the wet etching and the dry etching are sequentially performed to complete the via holes 112 in which the connection conductors 115 are formed.

In a case of forming the via hole 112 using only the wet etching, a horizontal cross-sectional area of the via hole 112 is rapidly increased as in the first inclined portion P1, thus, creating a limitation in an amount of thickness that the substrate 110 may be configured to have.

In addition, in a case of forming the via hole 112 using the dry etching, the thickness of the substrate 110 is relatively thicker than in a case in which the via hole 112 is formed using the wet etching. However, the inlet of the via hole 112 may become narrow. Thus, while the conductive layer is formed on the inner wall of the via hole 112, a connection defect between portions of the conductive layer may occur. For example, the conductive layer may not be appropriately deposited on edge portions connecting the via hole 112 and the lower surface of the substrate 110. As a result, a disconnection may occur in the connection conductor 115.

On the other hand, the acoustic resonator 100, according to an embodiment, includes improved via holes 112 by solving the problems of wet etching and dry etching and appropriately taking advantages of wet etching and dry etching.

An entire width (or diameter) of the via hole 112 is smaller than that of the via hole formed using the wet etching, and a smooth inclination of a via structure is obtained to solve a defect, such as a short-circuit that may occur at the time that the connection conductor 115 is formed. In addition, the substrate 110 is formed through dry etching to be thick to secure the entire rigidity of the acoustic resonator.

For example, while a portion of the via hole 112 in which the electrode is exposed is formed to have a width of 30 to 40 μm and a portion of the via hole 112 adjacent to the inlet thereof (adjacent to the lower surface of the substrate) is maintained to have a width of 80 μm or less, the thickness of the substrate 110 (or a depth of the via hole) is 100 μm or more.

Therefore, the depth of the via hole 112, according to an embodiment is larger than a maximum diameter thereof. In addition, as illustrated in FIG. 14, a ratio of the diameter of the via hole 112 to the depth of the via hole 112 is in a range of 3:10 or more to 8:10 or less. However, the ratio of the diameter of the via hole to the depth of the via hole is not limited to such configuration.

By using the thick substrate 110, the rigidity of the acoustic resonator, according to an embodiment is secured, and diversity of a design of the acoustic resonator, such as forming the thicknesses of the substrate 110 and the cover in a symmetrical form, is secured. In addition, because the inner surface of the via hole 112 is formed as an entirely smooth curved surface, the conductive layer is deposited to have a uniform thickness in the via hole 112.

Then, the external electrodes 117 are formed on the lower surface of the substrate 110 to complete the acoustic resonator 100, according to an embodiment as illustrated in FIG. 1.

The external electrodes 117 are formed along the circumferences of the via holes 112 on the lower surface of the substrate and are electrically connected to the connection conductors 115a and 115b formed in the via holes 112.

Through the above-mentioned embodiment, reliability of the connection conductors formed in the substrate are secured.

Meanwhile, the acoustic resonator and the manufacturing method thereof are not limited to the above-mentioned embodiments, but may be variously modified.

For example, an embodiment in which the connection conductors are formed after the cap is attached to the substrate has been described by way of example. However, a sequence of the above-mentioned operations is not limited thereto, but may be variously modified. For example, the cap may be attached to the substrate after the connection conductors are formed.

As set forth above, in the acoustic resonator and the manufacturing method thereof, according to various embodiments, the reliability of the connection conductors formed in the substrate is secured.

In addition, by using the substrate which is relatively thick, the rigidity of the acoustic resonator is secured, and the inner surfaces of the via holes formed in the substrate are formed as the entirely smooth curved surfaces. As a result, the conductive layers are deposited to have a uniform thickness in the via holes.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. An acoustic resonator, comprising:
 a resonance part comprising a first electrode, a second electrode, and a piezoelectric layer disposed between the first and second electrodes; and
 a substrate disposed below the resonance part and comprising a via hole penetrating through the substrate and a connection conductor disposed in the via hole and connected to at least one of the first and second electrodes, wherein inner surfaces of walls of the substrate forming the via hole comprise a first inclined portion disposed adjacently to the resonance part, a third inclined portion disposed adjacently to a lower surface of the substrate, and a second inclined portion disposed between the first and third inclined portions.

2. The acoustic resonator of claim 1, wherein the first inclined portion, the second inclined portion, and the third inclined portions comprise different gradients.

3. The acoustic resonator of claim 2, wherein a diameter of the via hole is increased toward the lower surface of the substrate.

4. The acoustic resonator of claim 2, wherein a depth of the via hole is larger than a maximum diameter of the via hole.

5. The acoustic resonator of claim 1, wherein the second inclined portion is longer than the first inclined portion and the third inclined portion, and the third inclined portion is shorter than the first inclined portion.

6. The acoustic resonator of claim 1, wherein an inner wall of the second inclined portion is perpendicular to the lower surface of the substrate.

7. The acoustic resonator of claim 1, wherein an angle of inclination between the lower surface of the substrate and the inner wall of the via hole is smaller in the first and third inclined portions than in the second inclined portion.

8. The acoustic resonator of claim 7, wherein an inner wall of the third inclined portion includes a curved surface.

9. The acoustic resonator of claim 7, wherein an inner wall of the third inclined portion includes a linear inclined surface.

10. The acoustic resonator of claim 1, wherein the via hole comprises a first via hole and a second via hole and the connection conductor comprises a first connection conductor and a second connection conductor, wherein the first connection conductor is formed within an inner surface of the first via hole and electrically connects the first electrode to an external electrode, and the second connection conductor is formed within an inner surface of the second via hole and electrically connects the second electrode to the external electrode.

11. A method to manufacture an acoustic resonator, the method comprising:
    forming a resonance part on a substrate;
    forming a portion of a via hole in the substrate through wet etching;
    completing the via hole in the substrate through dry etching; and
    forming a connection conductor around the via hole, wherein the completing of the via hole comprises forming inclined surfaces having different gradients on inner surfaces of walls of the substrate forming the via hole.

12. The method of claim 11, wherein the forming of the portion of the via hole comprises forming the via hole with a depth corresponding to a half of a thickness of the substrate.

13. The method of claim 11, wherein the forming of the resonance part comprises:
    forming a first electrode on the substrate;
    forming a piezoelectric layer on the first electrode; and
    forming a second electrode on the piezoelectric layer.

14. The method of claim 13, wherein in the forming of the connection conductor, one end of the connection conductor is bonded to the first electrode or the second electrode through the via hole.

15. A method to manufacture an acoustic resonator, the method comprising:
    forming a resonance part on a substrate;
    forming a portion of a via hole in the substrate through wet etching;
    completing the via hole in the substrate through dry etching; and
    forming a connection conductor around the via hole, wherein the completing of the via hole comprises forming a first inclined portion adjacently to the resonance part, forming a third inclined portion adjacently to a lower surface of the substrate, and forming a second inclined portion between the first and third inclined portions.

16. The method of claim 15, wherein the completing of the via hole comprises forming an angle of inclination between the lower surface of the substrate and an inner wall of the second inclined portion, wherein the angle of inclination is larger than angles of inclination between the lower surface of the substrate and inner walls of the first and third inclined portions.

17. The method of claim 15, wherein the forming of the resonance part comprises:
    forming a first electrode on the substrate;
    forming a piezoelectric layer on the first electrode; and
    forming a second electrode on the piezoelectric layer.

18. The method of claim 17, wherein in the forming of the connection conductor, one end of the connection conductor is bonded to the first electrode or the second electrode through the via hole.

* * * * *